United States Patent
Orem

(10) Patent No.: US 9,444,028 B2
(45) Date of Patent: Sep. 13, 2016

(54) APPARATUS, SYSTEMS AND METHODS FOR ELECTRICAL POWER GENERATION FROM HEAT

(71) Applicant: Peter Milon Orem, Renton, WA (US)

(72) Inventor: Peter Milon Orem, Renton, WA (US)

( * ) Notice: Subject to any disclaimer, the term of this patent is extended or adjusted under 35 U.S.C. 154(b) by 96 days.

(21) Appl. No.: 14/148,522

(22) Filed: Jan. 6, 2014

(65) Prior Publication Data

US 2014/0116489 A1    May 1, 2014

Related U.S. Application Data

(62) Division of application No. 13/229,339, filed on Sep. 9, 2011, now Pat. No. 8,624,100.

(60) Provisional application No. 61/381,984, filed on Sep. 11, 2010.

(51) Int. Cl.
   *H01L 35/32*    (2006.01)
   *H01L 35/14*    (2006.01)

(52) U.S. Cl.
   CPC ............ *H01L 35/32* (2013.01); *H01L 35/14* (2013.01)

(58) Field of Classification Search
   CPC ........ H01L 35/12; H01L 35/14; H01L 35/32
   See application file for complete search history.

(56) References Cited

U.S. PATENT DOCUMENTS

2011/0284049 A1* 11/2011  Iwai ................. H01L 35/32
                                                   136/240

FOREIGN PATENT DOCUMENTS

WO    WO2010073391    * 7/2010  ............ H01L 35/32

* cited by examiner

*Primary Examiner* — Jennifer Michener
*Assistant Examiner* — Bethany L Martin
(74) *Attorney, Agent, or Firm* — Mark L. Lorbiecki; Lawrence D. Graham; Michael D. Folue

(57) ABSTRACT

Systems and methods are operable to generate electric power from heat. An exemplary direct thermal electric converter embodiment includes at least a first recombination material having a first recombination rate, a second recombination material adjacent to the first recombination material and having a second recombination rate, wherein the second recombination rate is different from the first recombination rate, and a third recombination material adjacent to the second recombination material and having a third recombination rate substantially the same as the first recombination rate. Application of heat generates at least first charge carriers that migrate between the first recombination material and the second recombination material, and generates at least second charge carriers that migrate between the third recombination material and the second recombination material. The migration of the first charge carriers and the migration of the second charge carriers generates an electrical current.

4 Claims, 3 Drawing Sheets

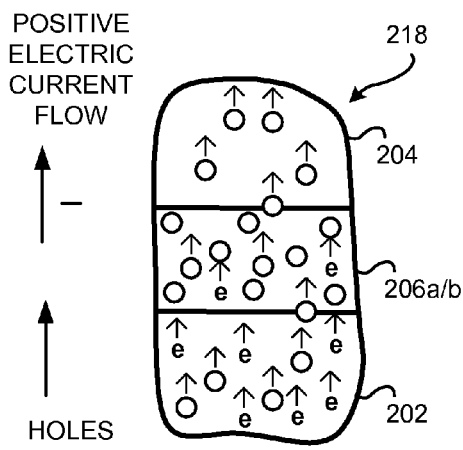
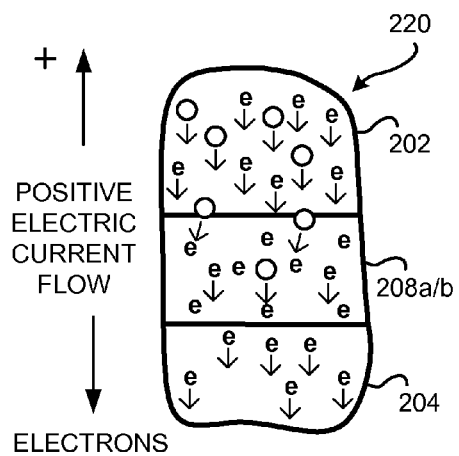
FIG. 3    FIG. 4
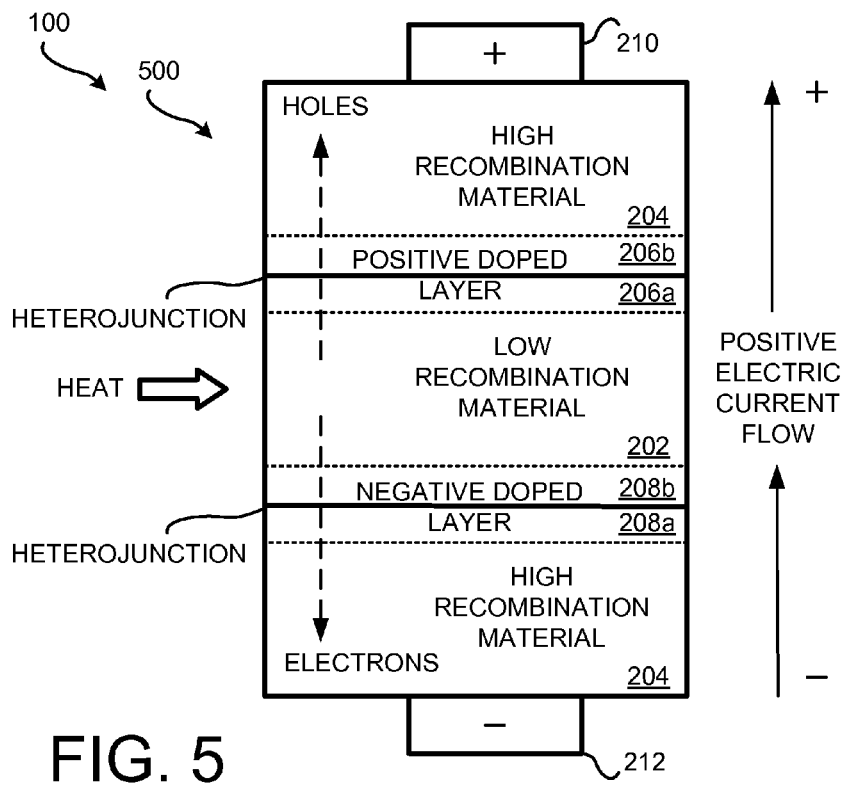
FIG. 5

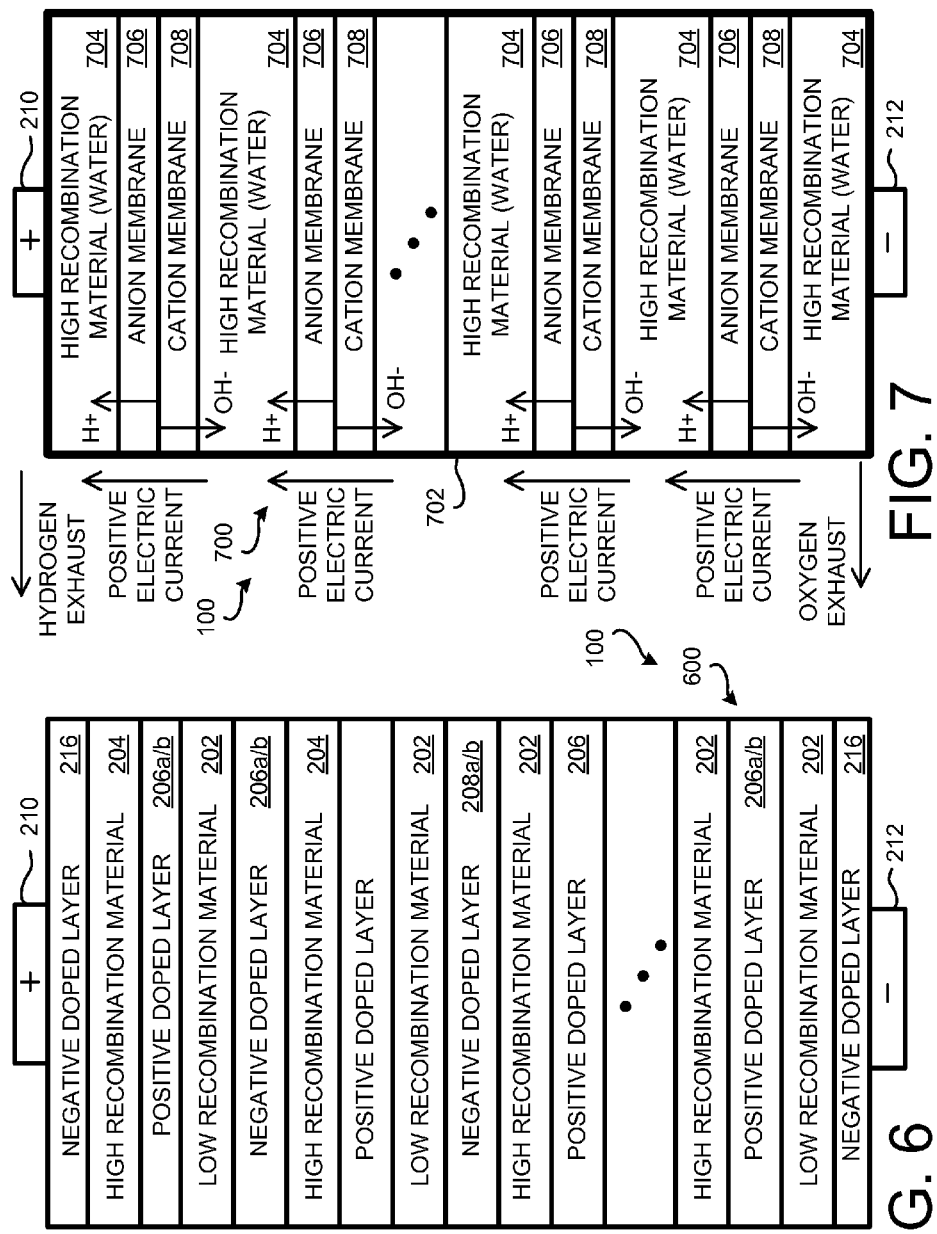

APPARATUS, SYSTEMS AND METHODS FOR ELECTRICAL POWER GENERATION FROM HEAT

PRIORITY CLAIM

This application is a divisional of U.S. Pat. No. 8,624,100 issued on Jan. 7, 2014, which is claims the benefit of and priority to U.S. provisional application entitled "Useful Electrical Power from Thermally Generated Carrier Pairs", having application Ser. No. 61/381,984, filed Sep. 11, 2010, and which is incorporated herein by reference in its entirety.

BACKGROUND

Heat is a readily available source of energy. Heat may be available from ambient sources, such as the atmosphere, flowing water, the sun, or geothermal fluids. Heat may also be a byproduct of a process such as steam-powered electrical generation, or industrial manufacturing, operating semiconductor devices, or the like.

However, it has been difficult to convert available heat energy into electrical power. For example, heat may be used to generate power using a secondary fluid, such as steam or the like, which drives a generator turbine.

Often, such as at electrical power generation stations and industrial manufacturing facilities, heat is considered as a waste byproduct that must be eliminated. When heat is a waste byproduct, for example, the waste heat is dissipated into the atmosphere using cooling towers or the like.

Accordingly, at least to improve thermal efficiency and perhaps to reduce systems complexity, there is a need in the arts to derive electrical power from available heat.

SUMMARY

Systems and methods of direct thermal electric conversion are disclosed. An exemplary embodiment includes at least a first recombination material having a first recombination rate, a second recombination material adjacent to the first recombination material and having a second recombination rate, wherein the second recombination rate is different from the first recombination rate, and a third recombination material adjacent to the second recombination material and having a third recombination rate substantially the same as the first recombination rate. Application of heat generates at least first charge carriers that migrate between the first recombination material and the second recombination material, and generates at least second charge carriers that migrate between the third recombination material and the second recombination material. The second charge carriers are opposite in polarity from the first charge carriers. The migration of the first charge carriers and the migration of the second charge carriers generates an electrical current.

BRIEF DESCRIPTION OF THE DRAWINGS

Preferred and alternative embodiments are described in detail below with reference to the following drawings:

FIG. 3 conceptually illustrates migration of mobile charge carriers from the low recombination material into the positive doped layer, and then the attendant migration of holes from the positive doped layer into the high recombination material;

FIG. 4 conceptually illustrates migration of mobile charge carriers from the low recombination material into the negative doped layer, and then the attendant migration of electrons from the negative doped layer into the high recombination material;

FIG. 5 is a block diagram of an alternative semiconductor embodiment of the direct thermal electric converter;

FIG. 6 is a block diagram of an alternative semiconductor embodiment of the direct thermal electric converter; and FIG. 7 is a block diagram of an electrochemical embodiment of the direct thermal electric converter.

DETAILED DESCRIPTION

Figure 1:
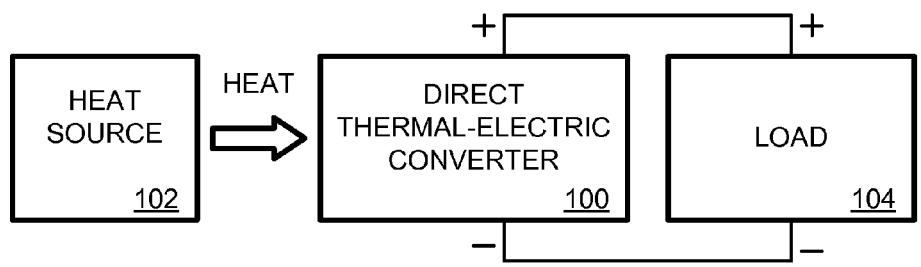
FIG. 1 is a block diagram of an embodiment of a direct thermal electric converter.

FIG. 1 is a block diagram of an embodiment of a direct thermal electric converter 100. Embodiments of the direct thermal electric converter 100 are configured to receive heat from a heat source 102, and are configured to generate electrical power from the received heat. The electrical power (current and voltage) is deliverable to a load 104. In some embodiments, the generated electrical power is output in a direct current (DC) form. In other embodiments which include power condition equipment, the generated electrical power may be output in an alternating current (AC) form.

The various semiconductor embodiments are configured to capture the "built-in" potential ($V_D$) of diodes by pitting the depletion regions of different materials against each other. The overall formula for carrier densities in semiconductors is demonstrated in Equation 1.

$$n*p = C*T^3 e^{(-Eg/kb*T)} \quad (1)$$

In Equation 1, n and p are electron and hole concentrations respectively, C is a material-specific constant, T is temperature (in Kelvins), Eg is the bandgap, and kb is Boltzmann's Constant. At ambient, kb*T is approximately 0.025 eV.

Figure 2:
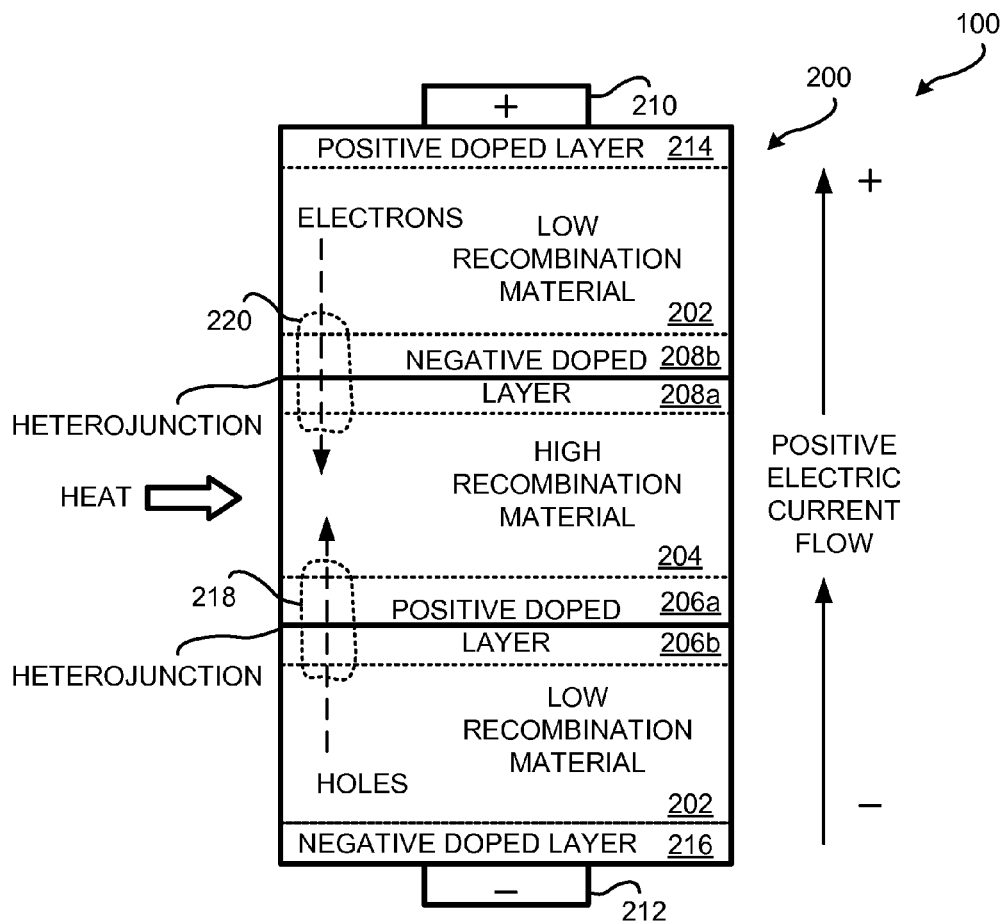
FIG. 2 is a block diagram of an exemplary semiconductor embodiment of the direct thermal electric converter.

FIG. 2 is a block diagram of an exemplary semiconductor embodiment 200 of the direct thermal electric converter 100. The exemplary semiconductor embodiment 200 comprises alternating layers of a low recombination material 202 (interchangeably referred to as a low recombination semiconductor material) and a high recombination material 204 (interchangeably referred to as a high recombination semiconductor material). The low recombination material 202 and the high recombination material 204 join at a heterojunction.

The high recombination material 204 may be doped with a positive doping material to form a positive doped layer 206a at one end and adjacent to the heterojunction. The high recombination material 204 may doped with a negative doping material to form a negative doped layer 208a at the other end and adjacent to the other heterojunction. Accordingly, a layer of high recombination material 204 remains that is not doped (and is thus on opposing sides of the positive doped layer 206a and the negative doped layer 208a).

The low recombination material 202 may also be doped with a positive doping material to form a positive doped layer 206b at one end and adjacent to the heterojunction. The low recombination material 202 may also be doped with a negative doping material to form a negative doped layer 208b at the other end and adjacent to the another heterojunction. Accordingly, a layer of low recombination material 202 remains that is not doped.

As illustrated in FIG. 2, the high recombination material 204 and the low recombination material 202 are separated by either a positive doped layer 206a/b or a negative doped layer 208a/b. Electrons may migrate across the heterojunction through the negative doped layer 208a/b. Holes may migrate across the heterojunction through the positive doped layer 206a/b. Electron and/or hole drift, diffusion, and thermionic emission (indicating crossing the heterojunction) may be interchangeably used for the term "migrate" herein.

A positive terminal 210 and a negative terminal 212 provide attachment points (a Schottky contact or the like) for delivery of the generated DC electric power. In alternative embodiments, an optional positive doped layer 214 and/or an optional negative doped layer 216 may be included at the ends of the low recombination material 202 and/or the high recombination material 204, respectively, to provide an ohmic type contact with the terminals 210, 212.

Any suitable low recombination material 202 and high recombination material 204 may be used. Any suitable doping material type, doping layer depth, and/or impurity concentration may be used in the various embodiments. In some embodiments, different doping materials may be used.

The low recombination material 202, the high recombination material 204, the positive doped layer 206a/b, and the negative doped layer 208a/b are semiconductor type materials wherein the bandgap between the conduction band and the valence band is relatively small (as compared to an insulator type material). In the high recombination material 204, electrons and holes may more easily recombine, or may be annihilated, as compared to the low recombination material 202. Since the rate at which electrons and holes recombine is inversely proportional to the electron and hole concentrations in the conduction and valence bands, respectively, the low recombination material 202 has relatively more free electrons and holes at any given temperature as compared to the high recombination material 204. Accordingly, there are a relatively greater number of free electrons and holes that are available to migrate from the low recombination material 202 (as compared to the high recombination material 204). Various embodiments may be created using selected materials with relatively high and low recombination rates of interest to achieve desired current and/or voltage in a semiconductor embodiment 200.

When heat energy is applied or transmitted into the semiconductor materials 202, 204, 206a/b, and/or 208a/b, mobile charge carriers (electrons) are able to migrate from their valence band up to their respective conduction band. Once the electron migrates to its conduction band, the electron may readily move to conduction bands of adjacent atoms or molecules. The associated hole created by the electron is also a mobile charge carrier that may readily migrate to adjacent atoms or molecules.

The mobile charge carriers (electron) of the low recombination material 202 tend to remain in the conduction bands due to the inherent nature of the low recombination material 202 which tends to resist recombination of the electron and hole pairs. Thus, it is relatively easy for the mobile charge carriers of the low recombination material 202 to migrate to other conduction bands of adjacent atoms or molecules.

In contrast, the electrons and/or holes that have migrated into the high recombination material 204 tend to recombine. Electron mobile charge carriers drop out of the conduction bands into available holes of the valence bands due to the inherent nature of the high recombination material 204 which tends to facilitate recombination of the electrons and/or holes. That is, it is relatively easy for the electrons in the conduction band to recombine with the holes of the valence bands.

The migration of mobile charge carriers (electrons and/or holes) may be directed, guided, limited and/or constrained in a manner that induces (generates) an aggregate electric current flow and an attendant voltage in the semiconductor embodiment 200 of the direct thermal electric converter 100. The current and voltage available at the terminals 210, 212 may then be provided to a load 104 (FIG. 1).

FIG. 3 shows a portion 214 of the semiconductor embodiment 200 that conceptually illustrates migration of mobile charge carriers (electrons and holes) from the low recombination material 202 into the positive doped layer 206a/b, and then the attendant migration of holes from the positive doped layer 206a/b into the high recombination material 204. FIG. 4 shows a portion 216 of the semiconductor embodiment 200 conceptually illustrates migration of mobile charge carriers (electrons and holes) from the low recombination material 202 into the negative doped layer 208a/b, and then the attendant migration of electrons from the negative doped layer 208a/b into the high recombination material 204. Holes are conceptually illustrated as a "o" and electrons are conceptually illustrated as an "e" in FIGS. 3 and 4. The holes are opposite in polarity from the electrons.

The positive doped layer 206a/b is a semiconductor layer fabricated with impurities that result in a relatively large number of holes in the positive doped layer 206a/b. As conceptually illustrated in FIG. 3, when the mobile charge carriers (electrons and/or holes) from an adjacent low recombination material 202 migrate into the positive doped layer 206a/b, the migrating electrons tend to be repelled or recombine with the holes of the positive doped layer 206a/b, respectively. However, the migrating holes from the low recombination material 202 tend to migrate through the positive doped layer 206a/b into the high recombination material 204. This net movement of holes from the low recombination material 202, through the positive doped layer 206a/b, and then the into the high recombination material 204 results in a generated current and voltage.

The negative doped layer 208a/b is fabricated with impurities that result in a relatively large number of electrons in the negative doped layer 208a/b. As conceptually illustrated in FIG. 4, when the mobile charge carriers (electrons and/or holes) from an adjacent low recombination material 202 migrate into the negative doped layer 208a/b, the migrating holes tend to be repelled or recombine with the electrons of the negative doped layer 208a/b, respectively. However, the migrating electrons from the low recombination material 202 tend to migrate through the negative doped layer 208a/b into the high recombination material 204. This net movement of electrons from the low recombination material 202, through the negative doped layer 208a/b, and then the into the high recombination material 204 results in a generated current and voltage.

The holes migrating through the positive doped layer 206a/b into the high recombination material 204 tend to combine with the electrons migrating through the negative doped layer 208a/b into the high recombination material 204. As the electrons and holes recombine in the high recombination material 204, additional mobile charge carriers (electrons and/or holes) tend to further migrate into the high recombination material 204. The continual migration of the mobile charge carriers tends into the high recombination material 204 results in a sustainable generated current and voltage so long as sufficient heat energy is available in the low recombination material 202 to generate mobile charge carriers. and a load is present to absorb the current. If no load is present, a maximum open circuit voltage will be reached, reducing the net migration to zero.

FIG. 5 is a block diagram of an alternative semiconductor embodiment 500 of the direct thermal electric converter 100. The semiconductor embodiment 500 comprises alternating layers of a high recombination material 204 and a low recombination material 202 which are separated by either a positive doped layer 206a/b or a negative doped layer 208a/b. A positive terminal 210 and a negative terminal 212 provide attachment points for delivery of the generated DC electrical power. In alternative embodiments, a positive doped layer and/or a negative doped layer (not shown) may be optionally included at the ends of the semiconductor embodiment 500 depending upon the material recombination type of the ending portions of the semiconductor materials.

FIG. 6 is a block diagram of an alternative semiconductor embodiment 600 of the direct thermal electric converter 100. The semiconductor embodiment 600 comprises a plurality of alternating layers of a high recombination material 204 and plurality of a low recombination material 202 which are separated by either a positive doped layer 206a/b or a negative doped layer 208a/b. A positive terminal 210 and a negative terminal 212 provide attachment points for delivery of the generated DC electrical power. In alternative embodiments, a positive doped layer 214 and/or a negative doped layer 216 may be optionally included at the ends of the semiconductor embodiment 200 depending upon the material recombination type of the ending portions of the semiconductor materials.

The plurality of layers of alternating high recombination material 204 and low recombination material 202 permit generation of a higher voltage and/or current at the terminals 210, 212. Accordingly, the design and fabrication of the semiconductor embodiment 500 may be engineered to provide any suitable voltage and/or current of interest. Either material may be used at a terminal, without regard to the material used at the opposite terminal.

In some applications, groups of the semiconductor embodiments 200, 500, 600 may be arranged in parallel and/or series connection configurations to further provide a voltage and/or current of interest. Thus, some semiconductor embodiments 200, 500, 600 may be configured to source low voltage and/or low current loads 400. Other semiconductor embodiments 200, 500, 600 may be configured to source high voltage and/or high current loads 104. Some embodiments may be configured to supplement, or even replace, power generation stations used in a public utility power grid or a private power system. Where waste heat is available, semiconductor embodiments 200, 500, 600 may be used for energy conservation, green power, and/or co-generation.

In a working semiconductor embodiment 600, a three inch wafer was fabricated using molecular beam epitaxy with 21 total layers (10.5 pairs), each 0.25 um thick, alternating 0.50 AlGaAs (50% Al) and 0.33 AlGaAs (30% Al) on an n-doped GaAs wafer. The top and bottom 10% (25 nm) of each layer were doped at 1.0E+18, with alternating doping at each heterojunction. Terminals 210, 212 were deposited on top and bottom of the finished wafer and annealed. Table 1 illustrates measured test performance results for the working semiconductor embodiment 600.

TABLE 1

| Temperature (F.) | Voltage (mV) | Current (uA) |
|---|---|---|
| 250 | 0.026 | 0.04 |
| 300 | 0.051 | 0.11 |
| 350 +/− 25 (cyclical) | | 0.03 to 0.72 |
| 450 +/− 25 (cyclical) | | 0.27 to 1.95 |
| 550 +/− 25 (cyclical) | | 0.40 to 3.07 |

Generally, the division between indirect and direct semiconductor materials is at about 41-43%. Higher than that is indirect, lower is direct. The exact percentage AL number may vary based on temperature and fabrication. The exemplary embodiment was fabricated at substantially 50% AL and substantially 30% AL. In an alternative embodiment fabricated using AlGaAs, a percentage greater than 50% AL and lower than 33% AL may be employed.

The semiconductor embodiments 200, 500, 600 may be readily fabricated using any suitable semiconductor fabrication process. Further, any suitable semiconductor material may be used in fabrication of a direct thermal electric converter 100. Other non-limiting examples of semiconductor materials include, but are not limited to, Ge, $Hg_{1-x}Cd_xTe$, SiGe superlattice, $In_xGa_{1-x}Sb$, GaSb, PbS, PbSe, or PbTe. Indirect narrow-gap superlattice materials, including $In_xGa_{1-x}Sb/Bi_ySb_{1-y}$ may be used.

Even when two semiconductors are both direct (or indirect), they may still have different recombination rates. Of particular interest are narrow gap direct semiconductors with different effective Densities of States, indicating different recombination rates. The differing density of state values may be selectively used in the fabrication of the semiconductor layers to control output current and/or voltage. In particular, Lead Sulfide (PbS) and Lead Telluride (PbTe) have a significant differences (for example, a factor of 1.6) at ambient temperature. In general, any pair of materials with a narrow bandgap and unequal recombination rates which can be grown together in the structure may be used in a semiconductor embodiment 200, 500, 600.

Additionally, or alternatively, the thickness of the semiconductor layers and/or doping layers may be varied to control output current and/or voltage. In some embodiments, additional layers may be inserted between the materials, such as metal layers within the doped regions, without adversely affecting performance. In an exemplary embodiment, the heterojunction is centered between, or is substantially centered between, the doping layers 208a/b. In other embodiments, the heterojunction may not be centered. In some embodiments, the heterojunction may be located outside the doped layer 208a/b. In such embodiments, the ratio of carriers may remain dominated by the effects of doping. Also, in such embodiments, one of the doped layers 208a/b would be inherently omitted.

FIG. 6 is a block diagram of an alternative semiconductor embodiment 600 of the direct thermal electric converter 100. The semiconductor embodiment 600 comprises a plurality of alternating layers of a high recombination material 204 and a low recombination material 202 which are separated by either a positive doped layer 206a/b or a negative doped layer 208a/b. A positive terminal 210 and a negative terminal 212 provide attachment points for delivery of the generated DC electrical power. In alternative embodiments, a positive doped layer 214 and/or a negative doped layer 216 may be optionally included at the ends of the semiconductor embodiment 200 depending upon the material recombination type of the ending portions of the semiconductor materials.

FIG. 7 is a block diagram of an electrochemical embodiment 700 of the direct thermal electric converter 100. The electrochemical embodiment 700 comprises an enclosure 702 enclosing a plurality of alternating layers of a high recombination material 704 and a low recombination material. The low recombination material is cooperatively formed by an anion membrane 706 and a cation membrane 708 in contact with each other. A positive terminal 210 and a negative terminal 212 provide attachment points for delivery of the generated DC electrical power.

In an exemplary embodiment, the high recombination material 704 is water. Preferably, the water of the high recombination material 704 is pure, or substantially pure. In some embodiments, chemical additives may be added to adjust the recombination. Alternatively, or additionally, another type of high recombination fluid or material may be used for the high recombination material 704.

When heat energy is added to the electrochemical embodiment 700, positive charge carriers and negative charge carriers are generated in the low recombination material cooperatively formed by the anion membrane 706 and the cation membrane 708. The negative charge carriers migrating into the water from the cation membrane 708 recombine with the positively charged carriers migrating into the water from the anion membrane 706 located on the opposing side of the water.

In an exemplary electrochemical embodiment 700, the positive charge carriers are hydrogen ions (H+). The hydrogen ions migrate towards their respective high recombination material 704, the water. The negative charge carriers in the electrochemical embodiment 700 are hydroxyl ions (OH−). The hydroxyl ions also migrate towards their respective high recombination material 704, the water. Movement of these positively charged hydrogen ions, and the opposite movement of the hydroxyl ions, results in a net migration of charge across the electrochemical embodiment 700, thereby resulting in a current and a voltage. The hydrogen ions are opposite in polarity from the hydroxyl ions.

Any suitable anion exchange membrane material may be used for the anion membrane 706. Any suitable cation exchange membrane material may be used for the cation membrane 708. An exemplary working embodiment employed an AMI-7001S Anion exchange membrane sandwiched with a CMI-7002 Cation Exchange membrane. Nine membrane pairs were arranged in a tray 702 and distilled water was used as the high recombination material 704

In the exemplary embodiment, hydrogen was exhausted from the enclosure 702 in proximity to the positive terminal 210. In some embodiments, the enclosure 702 may be configured to capture the exhausting hydrogen for use in other chemical or electrochemical processes.

In the exemplary embodiment, oxygen was exhausted from the enclosure 702 in proximity to the negative terminal 212. In some embodiments, the enclosure 702 may be configured to capture the exhausting oxygen for use in other chemical or electrochemical processes.

In an electrochemical embodiment 700 utilizing water as the high recombination material 704, the exhausting hydrogen and oxygen deplete the water. Accordingly, water may have to be added from time to time to extend the useful life of the electrochemical embodiment 700.

It should be emphasized that the above-described embodiments of the direct thermal electric converter 100 are merely possible examples of implementations of the invention. Many variations and modifications may be made to the above-described embodiments. All such modifications and variations are intended to be included herein within the scope of this disclosure and protected by the following claims.

The invention claimed is:

1. A direct thermal electric converter, comprising:
a first recombination material having a first recombination rate;
a second recombination material adjacent to the first recombination material and having a second recombination rate, wherein the second recombination rate is different from the first recombination rate; and
a third recombination material adjacent to the second recombination material and having a third recombination rate substantially the same as the first recombination rate,
wherein the first recombination material and the third recombination material are a high recombination semiconductor material having a high recombination rate, and wherein the second recombination material is a low recombination semiconductor material having a low recombination rate;
wherein application of heat generates at least first charge carriers that migrate between the first recombination material and the second recombination material,
wherein the application of heat generates at least second charge carriers that migrate between the third recombination material and the second recombination material, wherein the second charge carriers are opposite in polarity from the first charge carriers, and
wherein the migration of the first charge carriers and the migration of the second charge carriers generates an electrical current;
wherein the first recombination material and the second recombination material join at a first heterojunction, and wherein the second recombination material and the third recombination material join at a second heterojunction:
wherein the first recombination material comprises:
a negatively doped semiconductor layer adjacent to the first heterojunction; and
a high recombination semiconductor material layer adjacent to and on an opposing side of the negatively doped semiconductor layer of the first recombination material from the first heterojunction;
wherein the second recombination material comprises:
the negatively doped semiconductor layer adjacent to the first heterojunction;
a positively doped semiconductor layer adjacent to the second heterojunction; and
a low recombination semiconductor layer between the negatively doped semiconductor layer of the second recombination material and the positively doped semiconductor layer of the second recombination material;
wherein the third recombination material comprises:
the positively doped semiconductor layer adjacent to the second heterojunction; and
a high recombination semiconductor material adjacent to and on an opposing side of the positively doped semiconductor layer of the third recombination material from the second heterojunction, where in response to receiving heat, electrons are generated at least within the high recombination semiconductor material layer of the first recombination material,
wherein the electrons migrate through the negatively doped semiconductor layer of the first and the second recombination materials, where in response to receiving heat, holes are generated at least within the high recombination semiconductor material layer of the third recombination material, wherein the holes migrate through the positively doped semiconductor layer of the third and the second recombination materials, and wherein the migration of the electrons and the migration of the holes generate the electrical current.

2. The direct thermal electric converter of claim 1, wherein the first recombination semiconductor material and the second recombination semiconductor material join at a first heterojunction, and wherein a portion of the first recombination semiconductor material adjacent to the first heterojunction is positively doped, and wherein a portion of the second recombination semiconductor material adjacent to the first heterojunction is positively doped, and wherein the third recombination semiconductor material and the second recombination semiconductor material join at a second heterojunction, and wherein a portion of the third recombination semiconductor material adjacent to the second heterojunction is negatively doped, and wherein a portion of the second recombination semiconductor material adjacent to the second heterojunction is negatively doped.

3. The direct thermal electric converter of claim 1, further comprising:
a fourth recombination material adjacent to the first recombination material and having a fourth recombination rate substantially the same as the second recombination rate; and
a fifth recombination material adjacent to the fourth recombination material and having a fifth recombination rate substantially the same as the first recombination rate,
wherein application of heat generates at least first charge carriers that migrate between the fifth recombination material and the fourth recombination material,
wherein the application of heat generates at least second charge carriers that migrate between the fourth recombination material and the first recombination material.

4. A method for generating electrical current using a direct thermal electric converter, the method comprising:
applying heat to a direct thermal electric converter, the direct thermal electric converter including at least a first recombination material having a first recombination rate, a second recombination material adjacent to the first recombination material having a second recombination rate, a third recombination material adjacent to the second recombination material and having a third recombination rate, wherein the second recombination rate is different from the first recombination rate, and wherein the third recombination rate is substantially the same as the first recombination rate; and
supplying an electrical current from the direct thermal electric converter to a load,
wherein the first recombination material and the third recombination material are a high recombination semiconductor material having a high recombination rate, and wherein the second recombination material is a low recombination semiconductor material having a low recombination rate;
wherein application of heat generates at least negative charge carriers that migrate between the first recombination material and the second recombination material,
wherein the application of heat generates at least positive charge carriers that migrate between the third recombination material and the second recombination material, and
wherein the migration of the positive charge carriers and the migration of the negative charge carriers generates the electrical current supplied from the direct thermal electric converter to the load wherein the first recombination material and the second recombination material join at a first heterojunction, and wherein the second recombination material and the third recombination material join at a second heterojunction: wherein the first recombination material comprises: a negatively doped semiconductor layer adjacent to the first heterojunction; and a high recombination semiconductor material layer adjacent to an on an opposing side of the negatively doped semiconductor layer of the first recombination material from the first heterojunction; wherein the second recombination material comprises: the negatively doped semiconductor layer adjacent to the first heterojunction; a positively doped semiconductor layer adjacent to the second heterojunction; and a low recombination semiconductor layer between the negatively doped semiconductor layer of the second recombination material and the positively doped semiconductor layer of the second recombination material; wherein the third recombination material comprises: the positively doped semiconductor layer adjacent to the second heterojunction and a high recombination semiconductor material adjacent to and on an opposing side of the positively doped semiconductor layer of the third recombination material from the second heterojunction, wherein in response to receiving heat, electrons are generated at least within the high recombination semiconductor material layer of the first recombination material, wherein the electrons migrate through the negatively doped semiconductor layer of the first and second recombination materials, where in response to receiving heat, holes are generated at least within the high recombination semiconductor material of the third recombination material, wherein the holes migrate through the positively doped semiconductor layer of the third and the second recombination materials, and wherein the migration of the electrons and the migration of the holes generate the electrical current.

* * * * *